(12) United States Patent
Haist et al.

(10) Patent No.: US 10,505,057 B2
(45) Date of Patent: Dec. 10, 2019

(54) DEVICE AND METHOD FOR OPERATING CAMERAS AND LIGHT SOURCES WHEREIN PARASITIC REFLECTIONS FROM A PAIRED LIGHT SOURCE ARE NOT REFLECTED INTO THE PAIRED CAMERA

(71) Applicant: SYMBOL TECHNOLOGIES, LLC, Lincolnshire, IL (US)

(72) Inventors: Paul D. Haist, Toronto (CA); Alexandre Obotnine, North York (CA)

(73) Assignee: Symbol Technologies, LLC, Holtsville, NY (US)

(*) Notice: Subject to any disclaimer, the term of this patent is extended or adjusted under 35 U.S.C. 154(b) by 65 days.

(21) Appl. No.: 15/583,717

(22) Filed: May 1, 2017

(65) Prior Publication Data
US 2018/0315865 A1 Nov. 1, 2018

(51) Int. Cl.
*H01L 31/0232* (2014.01)
*H01L 27/146* (2006.01)
(Continued)

(52) U.S. Cl.
CPC ...... *H01L 31/02327* (2013.01); *G06F 3/0421* (2013.01); *G06K 7/10732* (2013.01); *G06K 7/10752* (2013.01); *H01L 27/14625* (2013.01); *H01L 31/0232* (2013.01); *H01L 31/054* (2014.12); *H04N 5/217* (2013.01); *H04N 5/2256* (2013.01); *H04N 5/2353* (2013.01);
(Continued)

(58) Field of Classification Search
CPC ............. G06F 3/0421; H01L 27/14625; H01L 31/0232; H01L 31/02327; H01L 31/054
USPC .............................................. 250/221, 214 R
See application file for complete search history.

(56) References Cited

U.S. PATENT DOCUMENTS 5,214,615 A    5/1993  Bauer
5,414,268 A *  5/1995  McGee ................ G01B 11/02
                                              250/559.26
(Continued)

FOREIGN PATENT DOCUMENTS

EP      0766098 A1    4/1997
EP      1311993 B1    5/2007
(Continued)

OTHER PUBLICATIONS

International Search Report and Written Opinion for International Patent Application No. PCT/US2013/070996 dated Apr. 2, 2014.
(Continued)

*Primary Examiner* — Que Tan Le

(57) ABSTRACT

Provided herein is a device and method for improved operating of cameras and light sources of a mobile automation apparatus. Light sources are operated to periodically provide illumination light for a camera operating according to a given exposure time and frequency, with a pulse duration having a respective frequency that is an integer multiple of the camera frequency, and higher than a threshold frequency where successive activations of the light sources are imperceptible. Furthermore, a light source paired with a camera is located at a distance from the paired camera that illuminates an object imaged by the paired camera, and where parasitic reflections from the paired light source are not reflected into the paired camera.

10 Claims, 11 Drawing Sheets

(51) Int. Cl.
*H01L 31/054* (2014.01)
*G06F 3/042* (2006.01)
*H04N 5/217* (2011.01)
*H04N 5/225* (2006.01)
*H04N 5/232* (2006.01)
*H04N 5/235* (2006.01)
*H04N 5/247* (2006.01)
*G06K 7/10* (2006.01)

(52) U.S. Cl.
CPC ....... *H04N 5/2354* (2013.01); *H04N 5/23206* (2013.01); *H04N 5/247* (2013.01)

(56) References Cited

U.S. PATENT DOCUMENTS

| | | | |
|---|---|---|---|
| 5,534,762 | A | 7/1996 | Kim |
| 5,566,280 | A | 10/1996 | Fukui et al. |
| 5,953,055 | A | 9/1999 | Huang et al. |
| 6,026,376 | A | 2/2000 | Kenney |
| 6,034,379 | A | 3/2000 | Bunte et al. |
| 6,075,905 | A | 6/2000 | Herman et al. |
| 6,141,293 | A | 10/2000 | Amorai-Moriya et al. |
| 6,304,855 | B1 | 10/2001 | Burke |
| 6,442,507 | B1 | 8/2002 | Skidmore et al. |
| 6,711,293 | B1 | 3/2004 | Lowe |
| 6,721,769 | B1 | 4/2004 | Rappaport et al. |
| 6,836,567 | B1 | 12/2004 | Silver et al. |
| 7,493,336 | B2 | 2/2009 | Noonan |
| 7,693,757 | B2 | 4/2010 | Zimmerman |
| 7,839,531 | B2 | 11/2010 | Sugiyama |
| 7,845,560 | B2 | 12/2010 | Emanuel et al. |
| 7,885,865 | B2 | 2/2011 | Benson et al. |
| 7,925,114 | B2 | 4/2011 | Mai et al. |
| 7,957,998 | B2 | 6/2011 | Riley et al. |
| 8,009,864 | B2 | 8/2011 | Linaker et al. |
| 8,049,621 | B1 | 11/2011 | Egan |
| 8,091,782 | B2 | 1/2012 | Cato et al. |
| 8,094,902 | B2 | 1/2012 | Crandall et al. |
| 8,189,855 | B2 | 5/2012 | Opalach et al. |
| 8,207,964 | B1 | 6/2012 | Meadow et al. |
| 8,233,055 | B2 | 7/2012 | Matsunaga et al. |
| 8,423,431 | B1 | 4/2013 | Rouaix et al. |
| 8,429,004 | B2 | 4/2013 | Hamilton et al. |
| 8,520,067 | B2 | 8/2013 | Ersue |
| 8,630,924 | B2 | 1/2014 | Groenevelt et al. |
| 8,923,893 | B2 | 12/2014 | Austin et al. |
| 8,939,369 | B2 | 1/2015 | Olmstead et al. |
| 8,954,188 | B2 | 2/2015 | Sullivan et al. |
| 9,129,277 | B2 | 9/2015 | MacIntosh |
| 9,135,491 | B2 | 9/2015 | Morandi et al. |
| 9,159,047 | B2 | 10/2015 | Winkel |
| 9,171,442 | B2 | 10/2015 | Clements |
| 9,349,076 | B1 | 5/2016 | Liu et al. |
| 9,367,831 | B1 | 6/2016 | Besehanic |
| 9,380,222 | B2 | 6/2016 | Clayton et al. |
| 9,424,482 | B2 | 8/2016 | Patel et al. |
| 9,811,754 | B2 | 11/2017 | Schwartz |
| 2003/0003925 | A1 | 1/2003 | Suzuki |
| 2003/0174891 | A1 | 9/2003 | Wenzel et al. |
| 2006/0032915 | A1 | 2/2006 | Schwartz |
| 2008/0025565 | A1 | 1/2008 | Zhang et al. |
| 2008/0294487 | A1 | 11/2008 | Nasser |
| 2009/0024353 | A1 | 1/2009 | Lee et al. |
| 2009/0059270 | A1 | 3/2009 | Opalach et al. |
| 2009/0060349 | A1 | 3/2009 | Linaker et al. |
| 2009/0063306 | A1 | 3/2009 | Fano et al. |
| 2009/0063307 | A1 | 3/2009 | Groenovelt et al. |
| 2009/0125350 | A1 | 5/2009 | Lessing et al. |
| 2009/0125535 | A1 | 5/2009 | Basso et al. |
| 2009/0160975 | A1 | 6/2009 | Kwan |
| 2009/0192921 | A1 | 7/2009 | Hicks |
| 2009/0206161 | A1 | 8/2009 | Olmstead |
| 2010/0070365 | A1 | 3/2010 | Siotia et al. |
| 2010/0141806 | A1 | 6/2010 | Uemura et al. |
| 2010/0171826 | A1 | 7/2010 | Hamilton et al. |
| 2010/0214873 | A1 | 8/2010 | Somasundaram et al. |
| 2010/0326939 | A1 | 12/2010 | Clark et al. |
| 2011/0242286 | A1 | 10/2011 | Pace et al. |
| 2011/0254840 | A1 | 10/2011 | Halstead |
| 2011/0288816 | A1 | 11/2011 | Thierman |
| 2012/0019393 | A1 | 1/2012 | Wolinsky et al. |
| 2012/0022913 | A1 | 1/2012 | Volkmann et al. |
| 2012/0169530 | A1 | 7/2012 | Padmanabhan et al. |
| 2012/0201466 | A1 | 8/2012 | Funayama et al. |
| 2012/0269383 | A1 | 10/2012 | Bobbitt et al. |
| 2012/0323620 | A1 | 12/2012 | Hofman et al. |
| 2013/0119138 | A1 | 5/2013 | Winkel |
| 2013/0134178 | A1 | 5/2013 | Lu |
| 2013/0154802 | A1 | 6/2013 | O'Haire et al. |
| 2013/0176398 | A1 | 7/2013 | Bonner et al. |
| 2013/0178227 | A1 | 7/2013 | Vartanian et al. |
| 2013/0182114 | A1 | 7/2013 | Zhang et al. |
| 2013/0226344 | A1 | 8/2013 | Wong et al. |
| 2013/0235165 | A1 | 9/2013 | Gharib et al. |
| 2013/0278631 | A1 | 10/2013 | Border et al. |
| 2013/0300729 | A1 | 11/2013 | Grimaud |
| 2013/0303193 | A1 | 11/2013 | Dharwada et al. |
| 2014/0003655 | A1 | 1/2014 | Gopalkrishnan et al. |
| 2014/0003727 | A1 | 1/2014 | Lortz et al. |
| 2014/0019311 | A1 | 1/2014 | Tanaka |
| 2014/0086483 | A1 | 3/2014 | Zhang et al. |
| 2014/0195374 | A1 | 7/2014 | Bassemir et al. |
| 2014/0214547 | A1 | 7/2014 | Signorelli et al. |
| 2014/0369607 | A1 | 12/2014 | Patel et al. |
| 2015/0029339 | A1 | 1/2015 | Kobres et al. |
| 2015/0088703 | A1 | 3/2015 | Yan |
| 2015/0117788 | A1 | 4/2015 | Patel et al. |
| 2015/0262116 | A1 | 9/2015 | Katircioglu et al. |
| 2015/0363758 | A1 | 12/2015 | Wu et al. |
| 2016/0092943 | A1 | 3/2016 | Vigier et al. |
| 2016/0112628 | A1 | 4/2016 | Super et al. |
| 2016/0328618 | A1 | 11/2016 | Patel et al. |
| 2016/0353099 | A1 | 12/2016 | Thomson et al. |
| 2017/0011281 | A1 | 1/2017 | Dijkman et al. |
| 2017/0032311 | A1 | 2/2017 | Rizzolo et al. |
| 2017/0193434 | A1 | 7/2017 | Shah et al. |
| 2017/0261993 | A1 | 9/2017 | Venable et al. |
| 2017/0286773 | A1 | 10/2017 | Skaff et al. |
| 2017/0286901 | A1 | 10/2017 | Skaff et al. |
| 2018/0001481 | A1 | 1/2018 | Shah et al. |
| 2018/0005176 | A1 | 1/2018 | Williams et al. |
| 2018/0020145 | A1 | 1/2018 | Kotfis et al. |
| 2018/0101813 | A1 | 4/2018 | Paat et al. |

FOREIGN PATENT DOCUMENTS

| | | |
|---|---|---|
| EP | 2309378 A2 | 4/2011 |
| EP | 2472475 A1 | 7/2012 |
| EP | 2662831 A2 | 11/2013 |
| GB | 2323238 A | 9/1998 |
| GB | 2330265 A | 4/1999 |
| KR | 101234798 B1 | 1/2009 |
| WO | 2003025805 A1 | 3/2003 |
| WO | 2006136958 A3 | 12/2006 |
| WO | 2007042251 A2 | 4/2007 |
| WO | 2012/154801 A1 | 11/2012 |
| WO | 2014181323 A1 | 11/2014 |
| WO | 2018018007 A1 | 1/2018 |

OTHER PUBLICATIONS

International Search Report and Written Opinion for International Patent Application No. PCT/US2013/053212 dated Dec. 1, 2014.
Duda, et al., "Use of the Hough Transformation to Detect Lines and Curves in Pictures", Stanford Research Institute, Menlo Park, California, Graphics and Image Processing, Communications of the ACM, vol. 15, No. 1 (Jan. 1972).
Bohm, "Multi-Image Fusion for Occlusion-Free Facade Texturing", International Archives of the Photogrammetry, Remote Sensing and Spatial Information Sciences, pp. 867-872 (Jan. 2004).

(56) References Cited

OTHER PUBLICATIONS

Senthilkumaran, et al., "Edge Detection Techniques for Image Segmentation—A Survey of Soft Computing Approaches", International Journal of Recent Trends in Engineering, vol. 1, No. 2 (May 2009).
Flores, et al., "Removing Pedestrians from Google Street View Images", Computer Vision and Pattern Recognition Workshops, 2010 IEEE Computer Society Conference on, IEE, Piscataway, NJ, pp. 53-58 (Jun. 13, 2010).
Uchiyama, et al., "Removal of Moving Objects from a Street-View Image by Fusing Multiple Image Sequences", Pattern Recognition, 2010, 20th International Conference on, IEEE, Piscataway, NJ, pp. 3456-3459 (Aug. 23, 2010).
Tseng, et al., "A Cloud Removal Approach for Aerial Image Visualization", International Journal of Innovative Computing, Information & Control, vol. 9 No. 6, pp. 2421-2440 (Jun. 2013).
United Kingdom Intellectual Property Office, Combined Search and Examination Report dated Mar. 11, 2015 for GB Patent Application No. 1417218.3.
United Kingdom Intellectual Property Office, Examination Report dated Jan. 22, 2016 for GB Patent Application No. 1417218.3 (2 pages).
United Kingdom Intellectual Property Office, Combined Search and Examination Report dated Jan. 22, 2016 for GB Patent Application No. 1521272.3 (6 pages).
Notice of allowance for U.S. Appl. No. 13/568,175 dated Sep. 23, 2014.
Notice of allowance for U.S. Appl. No. 13/693,503 dated Mar. 11, 2016.
Notice of allowance for U.S. Appl. No. 14/068,495 dated Apr. 25, 2016.
Notice of allowance for U.S. Appl. No. 15/211,103 dated Apr. 5, 2017.
Notice of allowance for U.S. Appl. No. 14/518,091 dated Apr. 12, 2017.
U.S. Appl. No. 15/583,680, filed May 1, 2017.
U.S. Appl. No. 15/583,801, filed May 1, 2017.
U.S. Appl. No. 15/583,740, filed May 1, 2017.
U.S. Appl. No. 15/583,759, filed May 1, 2017.
U.S. Appl. No. 15/583,773, filed May 1, 2017.
U.S. Appl. No. 15/583,786, filed May 1, 2017.
International Patent Application Serial No. PCT/CN2017/083143 filed May 5, 2017.
International Search Report and Written Opinion from International Patent Application No. PCT/US2018/030360 dated Jul. 9, 2018.
International Search Report and Written Opinion from International Patent Application No. PCT/US2018/030363 dated Jul. 9, 2018.
International Search Report and Written Opinion from International Patent Application No. PCT/US2018/030345 dated Sep. 17, 2018.
International Search Report and Written Opinion from International Patent Application No. PCT/US2019/025849 dated Jul. 9, 2019.

* cited by examiner

DEVICE AND METHOD FOR OPERATING CAMERAS AND LIGHT SOURCES WHEREIN PARASITIC REFLECTIONS FROM A PAIRED LIGHT SOURCE ARE NOT REFLECTED INTO THE PAIRED CAMERA

CROSS-REFERENCE TO RELATED APPLICATIONS

This application is related to U.S. Provisional Application No. 62/492,670 entitled "Product Status Detection System," filed on May 1, 2017, by Perrella et al., which is incorporated herein by reference in its entirety.

BACKGROUND OF THE INVENTION

Mobile automation apparatuses are increasingly being used in retail environments to perform inventory control. For example, such mobile automation apparatuses are generally equipped with various sensors to perform such tasks, as well as to autonomously navigate paths within the retail environment. During such autonomous navigation, the mobile automation apparatuses generally perform ancillary tasks that include data capture using cameras, for example capture of images of bar codes, printed price labels and the like, which can be located behind at least partially reflective, generally transparent surfaces. Due to the movement of the mobile automation apparatuses, the cameras are generally configured to operate over very short exposure times. Light sources that illuminate objects for which images are being acquired must generally be very bright. As the mobile automation apparatuses are powered from a battery, the light sources should be operated in a manner which minimizes the power draw on the battery. If, however, the light sources are operated only when the cameras are acquiring images, the pulse duration and frequency of the light sources may be such that strobe related discomfort may be induced in certain sensitive observers. Furthermore, as the mobile automation apparatuses generally include two are more cameras, parasitic reflections from the light sources can interfere with the image acquisition.

Accordingly, there is a need for a device and method for improved operating of cameras and light sources of a mobile automation apparatus in the above environment.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
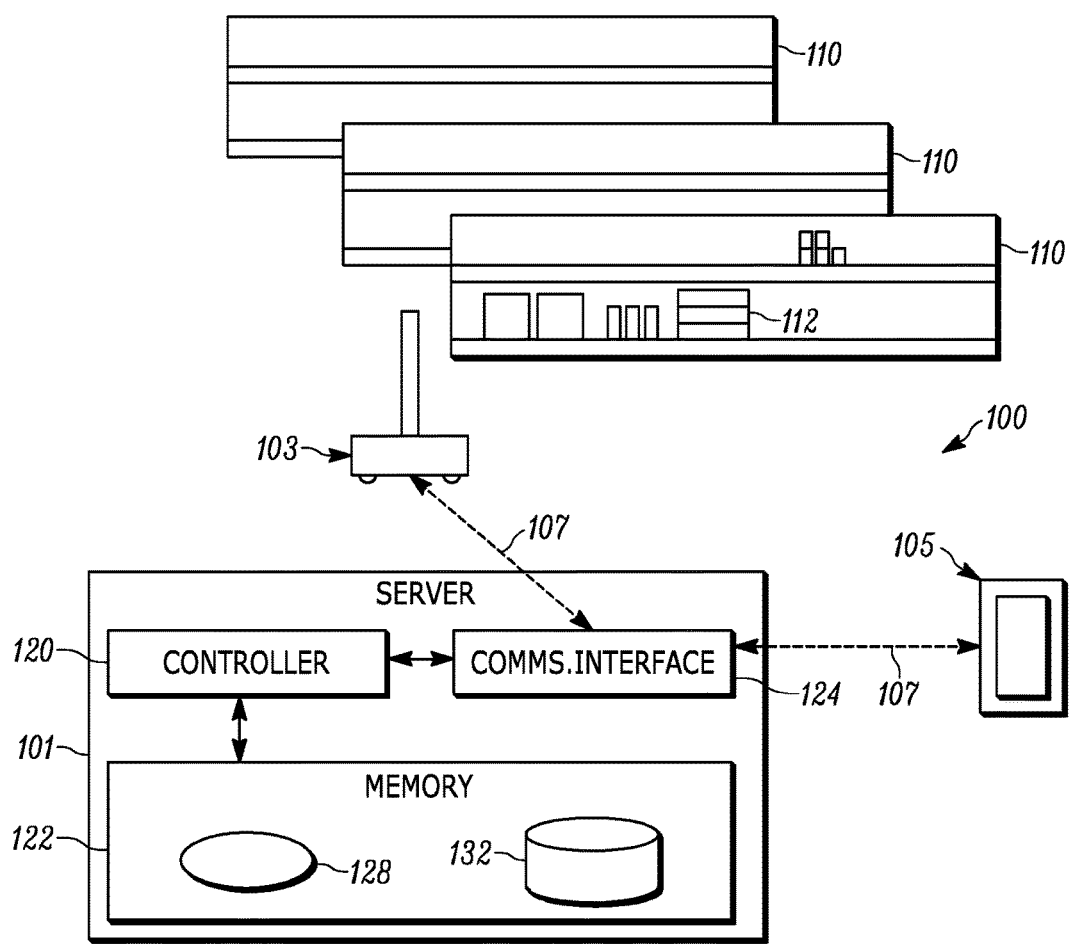
FIG. 1 is a block diagram of a mobile automation system in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

An aspect of the present specification provides a device comprising: a camera, configured to acquire images periodically according to a given exposure time, and at a first given frequency; and at least one light source configured to periodically provide illumination light for the camera, the illumination light having a pulse duration that corresponds to the given exposure time and having a second given frequency that is an integer multiple of the first given frequency, wherein the second given frequency is higher than a threshold frequency where successive activations of the at least one light source are imperceptible.

In some embodiments, each of the given exposure time and the pulse duration are about 0.5 ms.

In some embodiments, the first given frequency is about 5 Hz and the second given frequency is about 100 Hz.

In some embodiments, the threshold frequency is greater than about 70 Hz.

In some embodiments, the at least one light source comprises at least one light emitting diode.

In some embodiments, the second given frequency is higher than the threshold frequency where the successive activations of the at least one light source are imperceptible to a human vision system.

In some embodiments, the at least one light source and the camera are powered by a battery.

In some embodiments, the given exposure time is selected such that the images acquired by the camera are not blurry when the device is moving at a given speed.

Another aspect of the present specification provides a method comprising: at a device comprising controller, a camera and at least one light source, controlling, using the controller, the camera to acquire images periodically according to a given exposure time, and at a first given frequency; and controlling, using the controller, the at least one light source to periodically provide illumination light for the camera, the illumination light having a pulse duration that corresponds to the given exposure time and having a second given frequency that is an integer multiple of the first given frequency, wherein the second given frequency is higher than a threshold frequency where successive activations of the at least one light source are imperceptible. In some embodiments, the second given frequency is higher than the threshold frequency where the successive activations of the at least one light source are imperceptible to a human vision system.

A further aspect of the specification provides a non-transitory computer-readable medium storing a computer program, wherein execution of the computer program is for: at a device comprising controller, a camera and at least one light source, controlling, using the controller, the camera to acquire images periodically according to a given exposure time, and at a first given frequency; and controlling, using the controller, the at least one light source to periodically provide illumination light for the camera, the illumination light having a pulse duration that corresponds to the given exposure time and having a second given frequency that is an integer multiple of the first given frequency, wherein the second given frequency is higher than a threshold frequency where successive activations of the at least one light source are imperceptible. In some embodiments, the second given frequency is higher than the threshold frequency where the successive activations of the at least one light source are imperceptible to a human vision system Yet a further aspect of the specification provides a device comprising: a support structure; a plurality of cameras spaced along the support structure, wherein adjacent cameras have partially overlapping fields of view directed away from the support structure; and, a plurality of light sources comprising at least one light source paired with each of the plurality of cameras, wherein a paired light source is located at a distance from a paired camera that illuminates an object imaged by the paired camera, and where parasitic reflections from the paired light source are not reflected into the paired camera, and wherein the paired light source and the paired camera are operated at a different time from other paired light sources and other paired cameras located where the parasitic reflections from the paired light source are reflected into the other paired cameras.

In some embodiments, the paired light source and the paired camera are operated at a same time as associated paired light sources and associated paired cameras, the paired camera and the associated paired cameras each located where respective parasitic reflections from the paired light source and the associated paired light sources are not reflected into the paired camera and the associated paired cameras.

In some embodiments, the plurality of cameras is operated in a sequence with associated paired light sources.

In some embodiments, the device further comprises a mobile automation apparatus, the support structure disposed on the mobile automation apparatus, the plurality of cameras and the plurality of light sources spaced along the support structure.

In some embodiments, the device further comprises a mobile automation apparatus, the support structure comprising a mast disposed on the mobile automation apparatus, the plurality of cameras and the plurality of light sources vertically spaced along the mast.

In some embodiments, at least one camera is located between the paired light source and the paired camera along the support structure.

In some embodiments, each of the plurality of light sources is pitched, with respect to the support structure, in a direction of an associated paired camera.

In some embodiments, a given camera, of the plurality of cameras is paired with at least a first subset of the plurality of light sources located on one side of the given camera, and a second subset of the plurality of light sources located on an opposite side of the given camera.

In some embodiments, associated subsets of the plurality of light sources are located in rows along the support structure, perpendicular to a line between the plurality of cameras, and wherein at least some of the rows are operated at a same time to provide illumination light for at least two of the plurality of cameras.

Yet a further aspect of the specification provides a method comprising: at a device comprising: a controller; a support structure; a plurality of cameras spaced along the support structure, wherein adjacent cameras have partially overlapping fields of view directed away from the support structure; and, a plurality of light sources comprising at least one light source paired with each of the plurality of cameras, wherein a paired light source is located at a distance from a paired camera that illuminates an object imaged by the paired camera, and where parasitic reflections from the paired light source are not reflected into the paired camera, controlling, using the controller, the paired light source and the paired camera to operate at a different time from other paired light sources and other paired cameras located where the parasitic reflections from the paired light source are reflected into the other paired cameras; and controlling, using the controller, the paired light source and the paired camera to operate at a same time as associated paired light sources and associated paired cameras, the paired camera and the associated paired cameras each located where respective parasitic reflections from the paired light source and the associated paired light sources are not reflected into the paired camera and the associated paired cameras.

A further aspect of the specification provides a non-transitory computer-readable medium storing a computer program, wherein execution of the computer program is for: at a device comprising: a controller; a support structure; a plurality of cameras spaced along the support structure, wherein adjacent cameras have partially overlapping fields of view directed away from the support structure; and, a plurality of light sources comprising at least one light source paired with each of the plurality of cameras, wherein a paired light source is located at a distance from a paired camera that illuminates an object imaged by the paired camera, and where parasitic reflections from the paired light source are not reflected into the paired camera, controlling, using the controller, the paired light source and the paired camera to operate at a different time from other paired light sources and other paired cameras located where the parasitic reflections from the paired light source are reflected into the other paired cameras; and controlling, using the controller, the paired light source and the paired camera to operate at a same time as associated paired light sources and associated paired cameras, the paired camera and the associated paired cameras each located where respective parasitic reflections from the paired light source and the associated paired light sources are not reflected into the paired camera and the associated paired cameras.

FIG. 1 depicts a mobile automation system 100 in accordance with the teachings of this disclosure. The system 100 includes a server 101 in communication with at least one mobile automation apparatus 103 (also referred to herein simply as the apparatus 103) and at least one mobile device 105 via communication links 107, illustrated in the present example as including wireless links. The system 100 is deployed, in the illustrated example, in a retail environment including a plurality of modules 110 of shelves each supporting a plurality of products 112. More specifically, the apparatus 103 is deployed within the retail environment, and at least periodically communicates with the server 101 (via the link 107) as it navigates the length of at least a portion of the modules 110. The apparatus 103 is equipped with a plurality of data capture sensors, such as image sensors (e.g. one or more digital cameras) and depth sensors (e.g. one or more lidar sensors), and is further configured to employ the sensors to capture shelf data. In the present example, the apparatus 103 is configured to capture a series of digital images of the modules 110, as well as a series of depth measurements, each describing the distance and direction between the apparatus 103 and a point associated with the module 110, such as the shelf module 110 itself or products disposed thereon.

The server 101 includes a controller 120, interconnected with a non-transitory computer readable storage medium, such as a memory 122. The memory 122 includes any suitable combination of volatile (e.g. Random Access Memory or RAM) and non-volatile memory (e.g. read only memory or ROM, Electrically Erasable Programmable Read Only Memory or EEPROM, flash memory). In general, the controller 120 and the memory 122 each comprise one or more integrated circuits. The controller 120, for example, includes a special purpose controller having one or more of central processing units (CPUs) and graphics processing units (GPUs) and/or one or more of field-programmable gate arrays (FPGAs) and/or application-specific integrated circuits (ASICs) configured to implement the specific functionality of the server 101. In an embodiment, the controller 120, further includes one or more central processing units (CPUs) and/or graphics processing units (GPUs). In an embodiment, a specially designed integrated circuit, such as a Field Programmable Gate Array (FPGA), is designed to perform specific functionality of the server 101, either alternatively or in addition to the controller 120 and the memory 122. As those of skill in the art will realize, the mobile automation apparatus 103 also includes one or more controllers or processors and/or FPGAs, in communication with the controller 120, specifically configured to control navigational and/or data capture aspects of the mobile automation apparatus 103.

The server 101 also includes a communications interface 124 interconnected with the controller 120. The communications interface 124 includes any suitable hardware (e.g. transmitters, receivers, network interface controllers and the like) allowing the server 101 to communicate with other computing devices—particularly the apparatus 103 and the mobile device 105—via the links 107. The links 107 may be direct links, or links that traverse one or more networks, including both local and wide-area networks. The specific components of the communications interface 124 are selected based on the type of network or other links that the server 101 is required to communicate over. In the present example, a wireless local-area network is implemented within the retail environment via the deployment of one or more wireless access points. The links 107 therefore include both wireless links between the apparatus 103 and the mobile device 105 and the above-mentioned access points, and a wired link (e.g. an Ethernet-based link) between the server 101 and the access point.

The memory 122 stores a plurality of applications, each including a plurality of computer readable instructions executable by the controller 120. The execution of the above-mentioned instructions by the controller 120 configures the server 101 to perform various actions discussed herein. The applications stored in the memory 122 include a control application 128, which may also be implemented as a suite of logically distinct applications. In general, via execution of the control application 128 or subcomponents thereof, the controller 120 is configured to implement various functionality. The controller 120, as configured via the execution of the control application 128, is also referred to herein as the controller 120. As will now be apparent, some or all of the functionality implemented by the controller 120 described below may also be performed by preconfigured special purpose hardware elements (e.g. one or more ASICs) rather than by execution of the control application 128 by the controller 120.

In general, the controller 120 is configured to at least periodically communicate with the mobile automation apparatus 103, which autonomously navigates the environment and captures data, to obtain the captured data via the communications interface 124 and store the captured data in a repository 132 of the memory 122. The server 101 is further configured to perform various post-processing operations on the captured data, and to detect the status of the products 112 on the modules 110. When certain status indicators are detected, the server 101 is also configured to transmit status notifications to the mobile device 105.

For example, in some embodiments, the server 101 is configured via the execution of the control application 128 by the controller 120, to process image and depth data captured by the apparatus 103 to identify portions of the captured data depicting a back of a module 110, and to detect gaps between the products 112 based on those identified portions. In some embodiments navigation of the mobile automation apparatus is fully autonomous, while in other embodiments the server 101 facilitates navigation of the mobile automation apparatus 103 by providing a map and/or paths and/or path segments and/or navigation data and/or navigation instructions to the apparatus 103 to help the apparatus 103 navigate among the modules 110.

Figure 2:
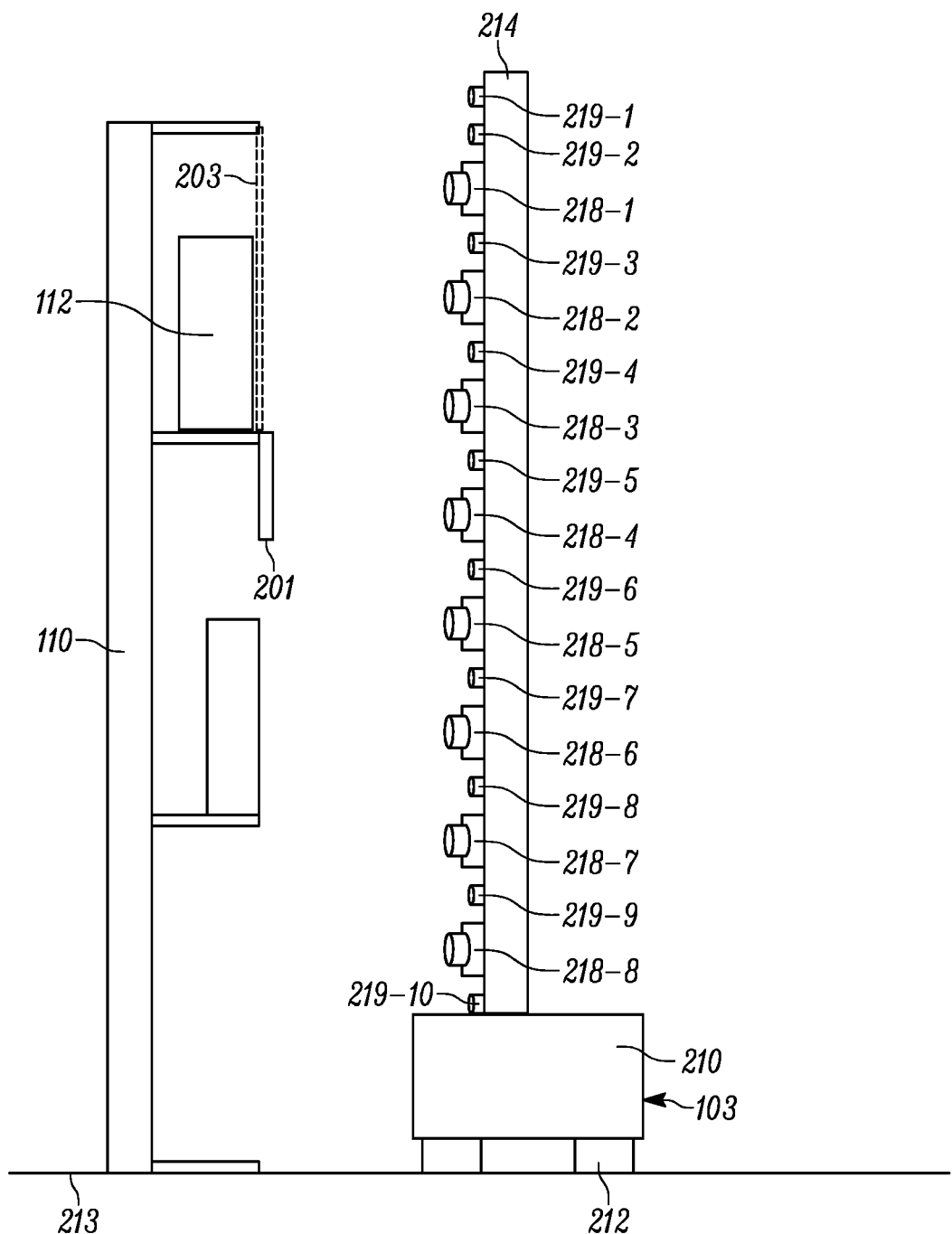
FIG. 2 is a side view of a mobile automation apparatus in accordance with some embodiments.
Figure 3:
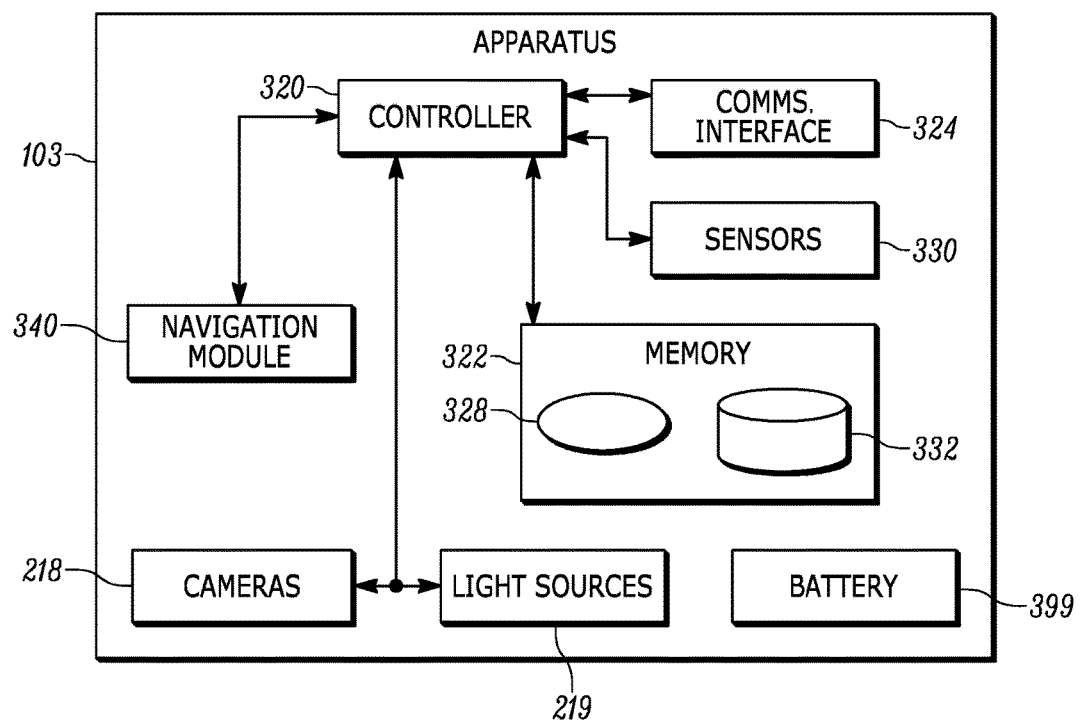
FIG. 3 is a block diagram of the mobile automation apparatus of FIG. 2 in accordance with some embodiments.

Attention is next directed to FIG. 2 and FIG. 3 which respectively depict: a schematic side perspective view of the apparatus 103, showing particular sensors of the apparatus 103; and a schematic block diagram of the apparatus 103.

With reference to FIG. 2, the apparatus 103 is being operated adjacent a module 110 having products 112 thereupon. Further, at least one label 201 is attached to a shelf of the module 110, and at least one product 112 is behind a door 203 made from glass, and the like. While only one label 201 is depicted it is appreciated a plurality of labels 201 is generally attached to the shelves of the module 110. The apparatus 103 generally comprises: a base 210 configured to move on wheels 212 (e.g. on a floor 213 of the environment), and the like; and a mast 214 and/or support structure extending in an upward direction (e.g. vertically) from the base 210. However, in other embodiments, the base 210 moves on devices other than wheels, for example casters, tracks and the like. In some embodiments, the base 210 and the mast 214 form a housing, however other types of housings, bases and/or support structures will occur to persons of skill in the art and are within the scope of present embodiments.

The apparatus 103 further includes a plurality of cameras 218-1, 218-2, 218-3, 218-4, 218-5, 218-6, 218-7, 218-8 (referred to hereafter, collectively, as the cameras 218 and, generically, as a camera 218), the cameras 218 spaced along the mast 214 and/or support structure, and in particular vertically spaced along the mast 214 and/or support structure, wherein adjacent cameras have partially overlapping fields of view directed away from the mast 214 and/or support structure. Put another way, the cameras 218 are directed away from the mast 214 and/or support structure that is disposed on the base 212, such that the centerline of the field of view of each camera 218 is perpendicular to the mast 214. The apparatus 103 further includes a plurality of light sources 219-1, 219-2, 219-3, 219-4, 219-5, 219-6, 219-7, 219-8, 219-9, 219-10 (referred to hereafter, collectively, as the light sources 219 and, generically, as a light source 219), at least one light source 219 paired with each of the plurality of cameras 218. When one of the cameras 218 is operated, the paired light source 219 is operated to illuminate a field of view of the camera 218, as described in further detail below.

While not depicted, the base 210 and/or the mast 214 are provisioned with other various navigation sensors for navigating in the environment in which the modules 110 are located and include various further obstacle detection sensors for detecting and avoiding obstacles.

As depicted the apparatus 103 is navigated along the module 110 (e.g. into the page or out of the page with reference to FIG. 2), and includes eight cameras 218 spaced along the mast 214, and ten light sources 219, the cameras 218 and light sources 219 operated to acquire images of the products 112 and/or labels 201 for use in one or of stock detection, low stock detection, price label verification, plug detection, planogram compliance and the like. For example, the products 112 and/or the labels 201 have barcodes, and the like, to be imaged and decoded. As those of skill in the art will realize, other numbers of cameras and light sources are within the scope of present embodiments.

Due to the speed of the apparatus 103 as it moves relative to the module 110, each of the cameras 218 are generally configured to acquire images periodically according to a given exposure time, and at a first given frequency. The given exposure time is generally selected such that images acquired by a camera 218 are not blurry when the device is moving at a given speed. For example, at speeds used by mobile automation apparatuses within retail environments (e.g. about 0.3 m/sec), each camera 218 is operated at about 5 Hz, with an exposure time of 0.5 ms.

However, other frequencies and exposure times are within the scope of present embodiments. When the apparatus 103 is to move at a speed slower than about 0.3 m/s, the frequency is decreased while exposure time is increased, and when the apparatus 103 is to move at a speed faster than about 0.3 m/s, the frequency is increased while the exposure time is decreased. Regardless, the given exposure time is generally selected such that images acquired by a camera 218 are not blurry when the device is moving at a given speed. The frequency is selected such that successively acquired images by a given camera 218 at least partially overlap at the given speed.

However, operating a paired light source 219 at the same first frequency and for a pulse duration that corresponds to the given exposure time can lead to strobing and/or flickering of the paired light source 219 that may be visible to an observer, for example either to a sensitive human or animal or to an electronic imaging device operating based on human vision system parameters.

An example, of an electronic imaging device operating based on human vision system parameters includes a light or imaging sensor that senses light using an image recognition rate that models human ability to process images.

While the light sources 219 may be operated in an always on manner to eliminate visibility of their successive activations, the light sources 219 are generally operated at about 500 W to ensure that features in images acquired by the cameras 218, including images of bar codes, are detectable and/or decodable. As the apparatus 103 is powered from a battery, each light source 219 being always on would significantly shorten the battery life.

Hence, to obviate such strobing, and to reduce the effect on battery life, for a camera 218 (configured to acquire images periodically according to a given exposure time, and at a first given frequency), at least one paired light source 219 is configured to periodically provide illumination light for the camera 218, the illumination light having a pulse duration that corresponds to the given exposure time and having a second given frequency that is an integer multiple of the first given frequency, wherein the second given frequency is higher than a threshold frequency where successive activations of the at least one light source are imperceptible, for example to the observers discussed above. Put another way, the second given frequency is higher than a threshold frequency where operation of the light source 219 appears to be continuous and/or always on, for example to the above observers. Put yet another way, above the threshold frequency, the strobing and/or flickering of the light source 219 is imperceptible.

In some example embodiments, the threshold frequency is greater than 70 Hz. Hence, when a camera 218 is operated at a frequency of 5 Hz, with an exposure time of 0.5 ms, a paired light source 219 is operated at a frequency that is an integer multiple of 5 Hz that is above 70 Hz, and with a pulse duration of 0.5 ms that is synchronized with the exposure time of the camera 218.

Operating cameras 218 and light sources 219 at such frequencies, and with such short exposure times (e.g. on the order of 0.5 ms) and/or pulse durations can be challenging. As such, in particular embodiments, the cameras 218 each comprise a "fast" CMOS (complementary metal-oxide-semiconductor) device, and the like, while each of the light sources 219, in an example embodiment, comprise at least one light emitting diode (LED) capable of providing around 500 W of illumination. However, other types of cameras and light sources are within the scope of the present specification. For example, a CCD (charge couple device) may be used in place of and/or in addition to, the CMOS device, presuming the CCD device is compatible with the exposure times.

Furthermore, a paired light source 219 for a paired camera 218 is located at a distance from the paired camera 218 that illuminates an object imaged by the paired camera 218, and where parasitic reflections from the paired light source 219 are not reflected into the paired camera 218. For example, such parasitic reflections include glare from shiny surfaces of the products 112 and/or labels 201 and/or shiny and/or reflective surfaces in front of each, such as from the reflective door 203. Furthermore, a given paired light source 219 and paired camera 218 are operated at a different time from other paired light sources 219 and other paired cameras 218 located where the parasitic reflections from the given paired light source 219 are reflected into the other paired cameras 218.

Referring now to FIG. 3, a schematic block diagram of further components of the apparatus 103 is depicted. In particular, the apparatus 103 includes a special purpose controller 320 specifically designed to control the cameras 218 and the light sources 219, as described herein. The controller 320 is interconnected with a non-transitory computer readable storage medium, such as a memory 322. The memory 322 includes any suitable combination of volatile (e.g. Random Access Memory or RAM) and non-volatile memory (e.g. read only memory or ROM, Electrically Erasable Programmable Read Only Memory or EEPROM, flash memory). In general, the controller 320 and the memory 322 each comprise one or more integrated circuits. The controller 320, for example, includes any suitable combination of central processing units (CPUs) and graphics processing units (GPUs) and/or any suitable combination of field-programmable gate arrays (FPGAs) and/or application-specific integrated circuits (ASICs) configured to implement the specific functionality of the apparatus 103. Further, as depicted, the memory 322 includes a repository 332 for storing data, for example data collected by sensors 330. In an embodiment, the controller 320, further includes one or more central processing units (CPUs) and/or graphics processing units (GPUs). In an embodiment, a specially designed integrated circuit, such as a Field Programmable Gate Array (FPGA), is designed to control the cameras 218 and the light sources 219 as discussed herein, either alternatively or in addition to the controller 320 and memory 322. As those of skill in the art will realize, the mobile automation apparatus 103 can also include one or more speicial purpose controllers or processors and/or FPGAs, in communication with the controller 320, specifically configured to control navigational and/or data capture aspects of the mobile automation apparatus 103.

The apparatus 103 also includes a communications interface 324 interconnected with the controller 320. The communications interface 324 includes any suitable hardware (e.g. transmitters, receivers, network interface controllers and the like) allowing the apparatus 103 to communicate with other devices—particularly the server 101 and, optionally, the mobile device 105—for example via the links 107, and the like. The specific components of the communications interface 324 are selected based on the type of network or other links over which the apparatus 103 is required to communicate, including, but not limited to, the wireless local-area network of the retail environment of the system 100.

The memory 322 stores a plurality of applications, each including a plurality of computer readable instructions executable by the controller 320. The execution of the above-mentioned instructions by the controller 320 configures the apparatus 103 to perform various actions discussed herein. The applications stored in the memory 322 include a control application 328, which may also be implemented as a suite of logically distinct applications. In general, via execution of the control application 328 or subcomponents thereof, the controller 320 is configured to implement various functionality. As will now be apparent, some or all of the functionality implemented by the controller 320 described below may also be performed by preconfigured hardware elements (e.g. one or more ASICs) rather than by execution of the control application 328 by the controller 320.

The apparatus 103 further includes sensors 330, including, but not limited to, LiDAR (Light Detection and Ranging) sensors, as well as other navigation sensors and/or data acquisition sensors (other than the cameras 218 and the light sources 219) and/or obstacle avoidance sensors.

The apparatus 103 further includes a navigation module 340 configured to move the apparatus 103 in an environment, for example the environment of the modules 110. The navigation module 340 comprises any suitable combination of motors, electric motors, stepper motors, and the like configured to drive and/or steer the wheels 212, and the like, of the apparatus 103.

Hence, in general, the controller 320 is configured to control the apparatus 103 to navigate the environment of the module 110 using data from the navigation sensors to control the navigation module 340 including, but not limited to, avoiding obstacles. For example, while not depicted, the memory 322 further stores a map, and the like, of the environment, which is used for navigation in conjunction with the navigation sensors.

The controller 320 is in communication with the cameras 218 and the light source 219 which are powered by a battery 399. Indeed, the apparatus 103 is generally powered by the battery 399.

In the present example, in particular, the apparatus 103 is configured via the execution of the control application 328 by the controller 320, to control the cameras 218 and light sources 219 to acquire images (e.g. digital images, and the like) used for one or more of stock detection, low stock detection, price label verification, plug detection, planogram compliance and the like.

Figure 4:
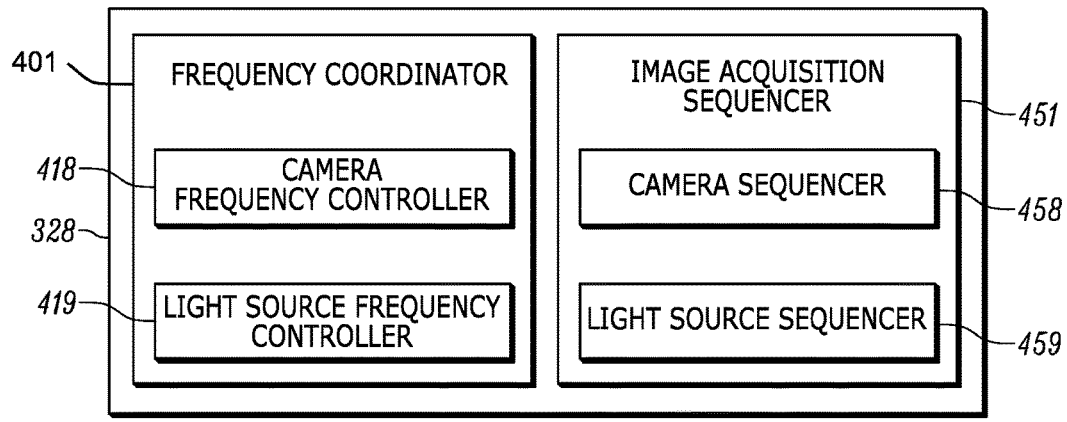
FIG. 4 is a block diagram of a control application in accordance with some embodiments.

Turning now to FIG. 4, before describing the operation of the application 328 to control the cameras 218 and light sources 219 to acquire images, certain components of the application 328 will be described in greater detail. As will be apparent to those skilled in the art, in other examples the components of the application 328 may be separated into distinct applications, or combined into other sets of components. Alternatively or in addition, some or all of the components illustrated in FIG. 4 may also be implemented as dedicated hardware components (e.g. one or more special purpose FPGAs and/or one or more ASICs connected to the controller 320).

The control application 328 includes a frequency coordinator 401. In brief, the frequency coordinator 401 is configured to coordinate the frequency of operation of a pair of a camera 218 and a light source 219 providing illumination light for the camera 218.

The frequency coordinator 401 includes: a camera frequency controller 418 configured to control a frequency of operation of a camera 218; and a light source frequency controller 419, configured to control a frequency of operation of a light source 219 paired with the camera 218 being controlled by the camera frequency controller 418.

The control application 328 further includes an image acquisition sequencer 451. In brief, the frequency coordinator 401 is configured to sequence image acquisition of the plurality of cameras 218 in conjunction with controlling the plurality of light sources 219.

The image acquisition sequencer 451 includes: a camera sequencer 458 configured to sequence operation of the cameras 218; and a light source sequencer 459 configured to sequence operation of the light sources 219 in conjunction with paired with the camera being controlled by the camera frequency controller 418.

The frequency coordinator 401 and the image acquisition sequencer 451 are used in conjunction with each other to control and coordinate respective frequencies of operation of a light source 219 with a paired camera 218, and to sequence operation of the plurality of cameras 218 with their paired light sources 219.

Figure 5:
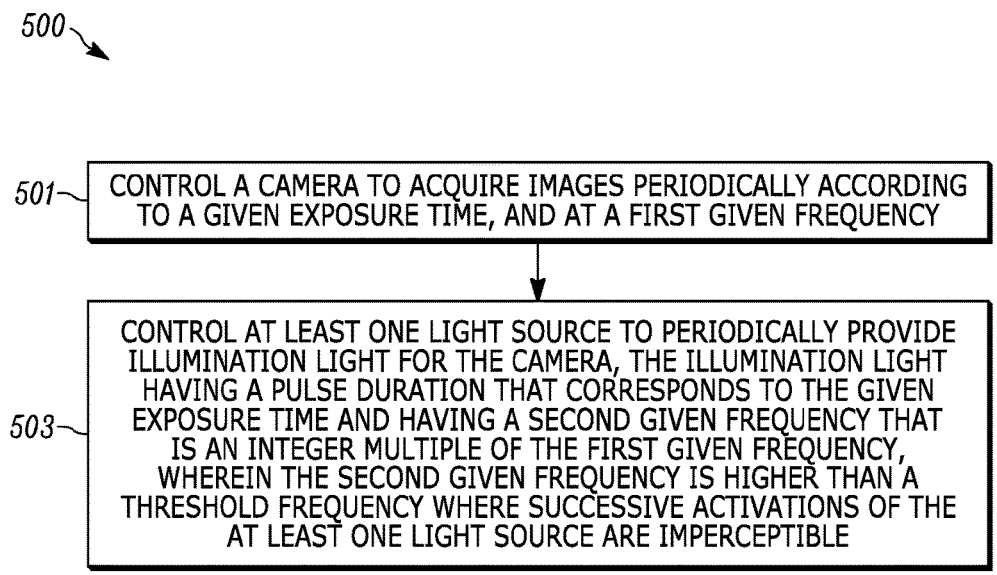
FIG. 5 is a flowchart of a method of operating a camera and at least one light source to prevent seizures in accordance with some embodiments.

Attention is now directed to FIG. 5 which depicts a flowchart representative of an example method 500 for coordinating coordinate respective frequencies of operation of a light source 219 with a paired camera 218. The example operations of the method 500 of FIG. 5 correspond to machine readable instructions that are executed by, for example, the apparatus 103, and specifically by the controller 320 and/or the various components of the control application 328 including, but not limited to, the frequency coordinator 401. Indeed, the example method 500 of FIG. 5 is one way in which the apparatus 103 is configured. However, the following discussion of the example method 500 of FIG. 5 will lead to a further understanding of the apparatus 103, and its various components. However, it is to be understood that in other embodiments, the apparatus 103 and/or the method 500 are varied, and hence need not work exactly as discussed herein in conjunction with each other, and that such variations are within the scope of present embodiments.

Furthermore, the example method 500 of FIG. 5 need not be performed in the exact sequence as shown and likewise, in other embodiments, various blocks may be performed in parallel rather than in sequence. Accordingly, the elements of method 500 are referred to herein as "blocks" rather than "steps." The example method 500 of FIG. 5 may be implemented on variations of the example apparatus 103, as well.

At block 501, the controller 320 controls a camera 218 to acquire images periodically according to a given exposure time, and at a first given frequency.

At the block 503, the controller 320 controls at least one light source 219 (e.g. paired with the camera controlled at the block 501) to periodically provide illumination light for the camera 218, the illumination light having a pulse duration that corresponds to the given exposure time and having a second given frequency that is an integer multiple of the first given frequency, wherein the second given frequency is higher than a threshold frequency where successive activations of the at least one light source are imperceptible.

Figure 6:
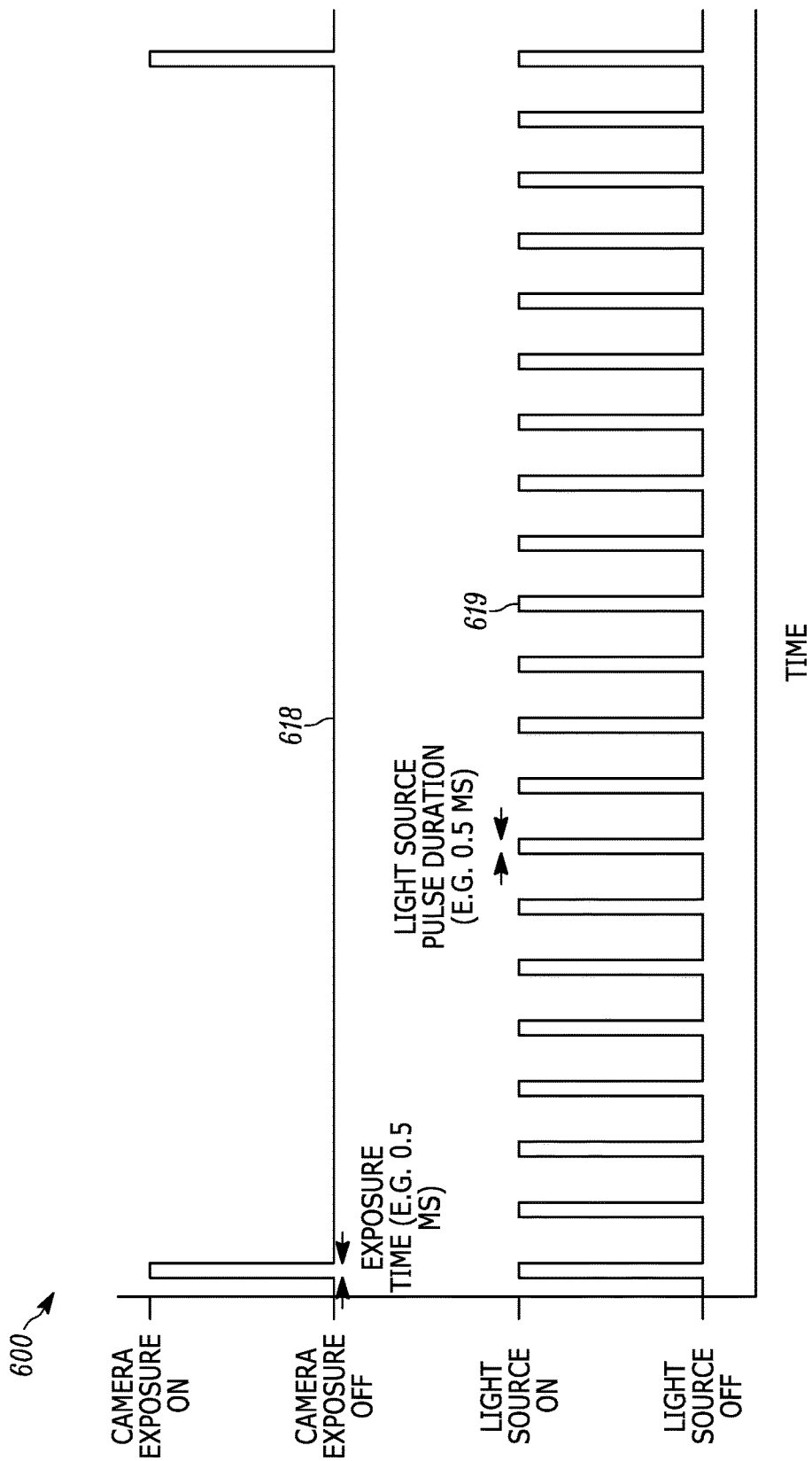
FIG. 6 is a timing diagram for implementing the method of FIG. 5 in accordance with some embodiments.

The method 500 is now described with reference to FIG. 6, which schematically depicts a timing diagram 600 of frequency of operation of a camera 218, and concurrent frequency of operation of a paired light source 219. The timing diagram 600 is understood to be schematic and the ratio of the camera 218 on times to off times is not to scale, and indeed neither is the ratio of the light source 219 on time to off times to scale.

In particular, a pulse train 618 shows exposure pulses of a camera 218 that is controlled (e.g. at the block 501 and/or using the camera frequency controller 418) to periodically operate according to a first frequency and according to a given exposure time (e.g. 0.5 ms). In other words, presuming that the first given frequency is "N" Hz, every 1/N seconds, the camera 218 is controlled to expose the CMOS device, and the like, for the given exposure time. Hence, if the given exposure time is 0.5 ms, and the first frequency is 5 Hz, every 200 ms, the camera 218 is exposed for 0.5 ms.

Furthermore, a pulse train 619 shows "on" pulses of a light source 219 operated to provide illumination light for the camera 218 operating according to a pulse train 618. The light source 219 is controlled (e.g. at the block 503 and/or using the light source frequency controller 419) to periodically provide illumination light for the camera 218. The illumination light has a pulse duration that corresponds to the given exposure time of the camera (e.g. 0.5 ms) and has a second given frequency that is an integer multiple of the first given frequency, wherein the second given frequency is higher than a threshold frequency where successive activations of the at least one light source are imperceptible.

Furthermore, the light pulses are coordinated with the exposure of the camera 218. For example, presuming that "M" is an integer, the second given frequency is M*N Hz, and hence the light source 219 provides a light pulse every 1/(M*N) seconds. Furthermore, in some example embodiments, as depicted, every $M^{th}$ light pulse being coincident with an exposure of the camera 218 such that every $M^{th}$ light pulse provides illumination for the camera 218 while the camera 218 is acquiring an image. Put another way, every $M^{th}$ light pulse is coincident in time with a corresponding camera exposure.

For example, if there are 20 light pulses (e.g. "M" light pulses) for each camera exposure, the second given frequency of operation of the light source 219 would be 100 Hz.

Furthermore, if the given pulse duration time is 0.5 ms (e.g. the same as the camera exposure time), and the second given frequency is 100 Hz (there are 20 light pulses for each camera exposure and/or "M"=20), every 10 ms, the light source 219 provides a light pulse that is 0.5 ms long. The light source 219 is hence only "on" 5% of the time, which reduces the impact of the light source 219 on the life of the battery 399. Furthermore, as the frequency of operation of the light source 219 is above a threshold frequency where successive activations of the light source 219 are imperceptible, the chance of the light source 219 inducing discomfort to an observer is eliminated.

The threshold frequency generally depends on the pulse duration of the light source 219. For example, for pulse durations around 0.5 ms, the threshold frequency has been determined to be above 70 Hz for many observers. However, as the pulse duration increases (e.g. along with the exposure time of a paired camera 218) the threshold frequency may decrease for some observers; and similarly, as the pulse duration decreases (e.g. along with the exposure time of a paired camera 218) the threshold frequency may increase for some observers.

Those of skill in the art will realize that other combinations of camera exposure times, light pulse duration times, and frequencies are within the scope of present embodiments. For example, the camera exposure time and camera operation frequency is generally selected based on the speed of the apparatus 103 to ensure that successive images acquired by same camera 218 at least partially overlap. As the speed of the apparatus 103 increases or decreases, the camera exposure time and camera operation frequency are adjusted accordingly, and hence so is the light pulse duration and the light source frequency.

Either way, the light source 219 is operated at a frequency higher than the threshold frequency where successive activations of the light source 219 are imperceptible to an observer making the light source 219 appear to be continuous and/or always on.

It is further appreciated that each of the plurality of camera 218, along with their respective paired light sources 219, are controlled according to the method 500. However, as light sources 219 that are not paired with a given camera 218 can cause glare, and/or other types of parasitic reflections, the operation of the cameras 218 and paired light sources 219 are generally sequenced.

Figure 7:
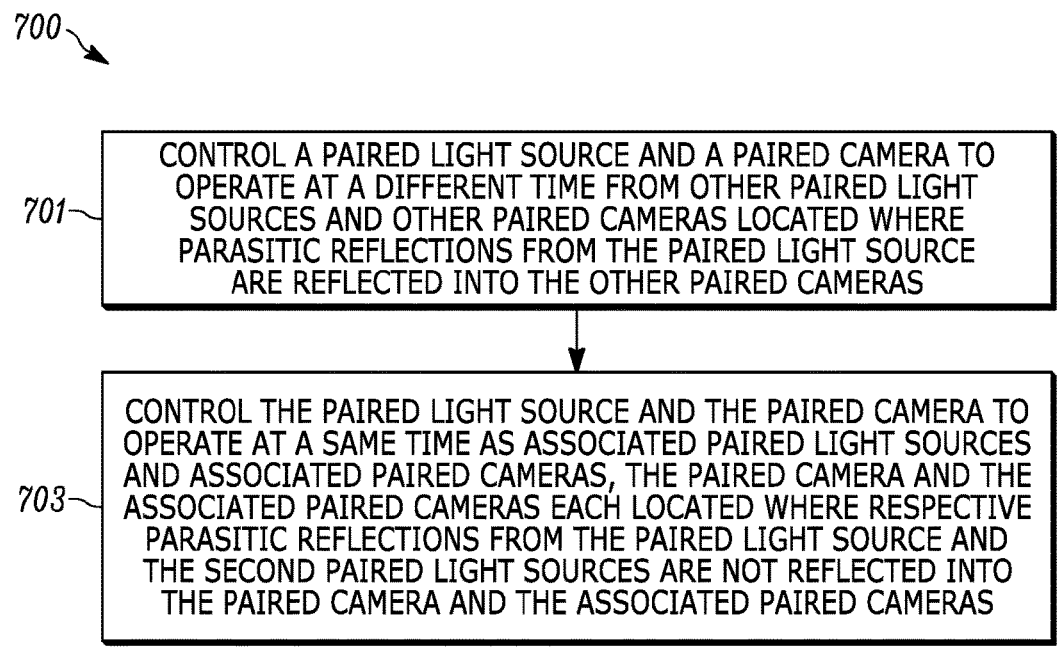
FIG. 7 is a flowchart of a method of operating cameras and light sources to prevent parasitic reflections from interfering with image acquisition in accordance with some embodiments.

Hence, attention is now directed to FIG. 7 which depicts a flowchart representative of an example method 700 for sequencing image acquisition using cameras and light sources. The example operations of the method 700 of FIG. 7 correspond to machine readable instructions that are executed by, for example, the apparatus 103, and specifically by the controller 320 and/or the various components of the control application 328 including, but not limited to, the image acquisition sequencer 451. Indeed, the example method 700 of FIG. 7 is one way in which the apparatus 103 is configured. However, the following discussion of the example method 700 of FIG. 7 will lead to a further understanding of the apparatus 103, and its various components. However, it is to be understood that in other embodiments, the apparatus 103 and/or the method 700 are varied, and hence need not work exactly as discussed herein in conjunction with each other, and that such variations are within the scope of present embodiments.

Furthermore, the example method 700 of FIG. 7 need not be performed in the exact sequence as shown and likewise, in other embodiments, various blocks may be performed in parallel rather than in sequence. Accordingly, the elements of method 700 are referred to herein as "blocks" rather than "steps." The example method 700 of FIG. 7 may be implemented on variations of the example apparatus 103, as well.

At block 701, the controller 320 controls a paired light source 219 and a paired camera 218 to operate at a different time from other paired light sources 219 and other paired cameras 218 located where the parasitic reflections from the paired light source 219 are reflected into the other paired cameras 218.

At block 703, the controller 320 controls the paired light source 219 and the paired camera 218 (i.e. of the block 701) to operate at a same time as associated paired light sources 219 and associated paired cameras 218, the paired camera 218 (i.e. of the block 701) and the associated paired cameras 218 each located where respective parasitic reflections from the paired light source 219 (i.e. of the block 701) and the associated paired light sources 219 are not reflected into the paired camera 218 and the associated paired cameras 218.

Indeed, the blocks 701, 703 are generally executed concurrently to determine which pairs of cameras 218 and light sources 219 are to be operated at any given time using, for example, the camera sequencer 458 and the light source sequencer 459. Furthermore, the method 700 is generally dependent on a geometry and/or physical arrangement of the cameras 218 and light sources 219.

Figure 8:
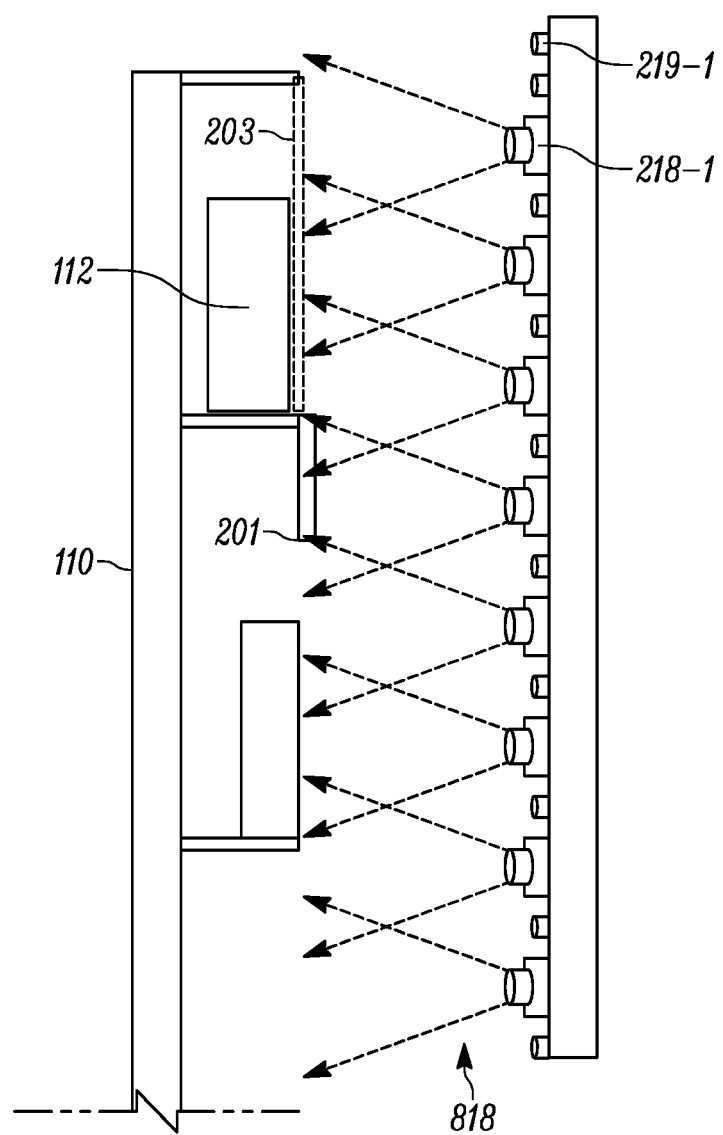
FIG. 8 depicts the fields of view of the cameras of the apparatus of FIG. 2 in accordance with some embodiments.
Figure 9:
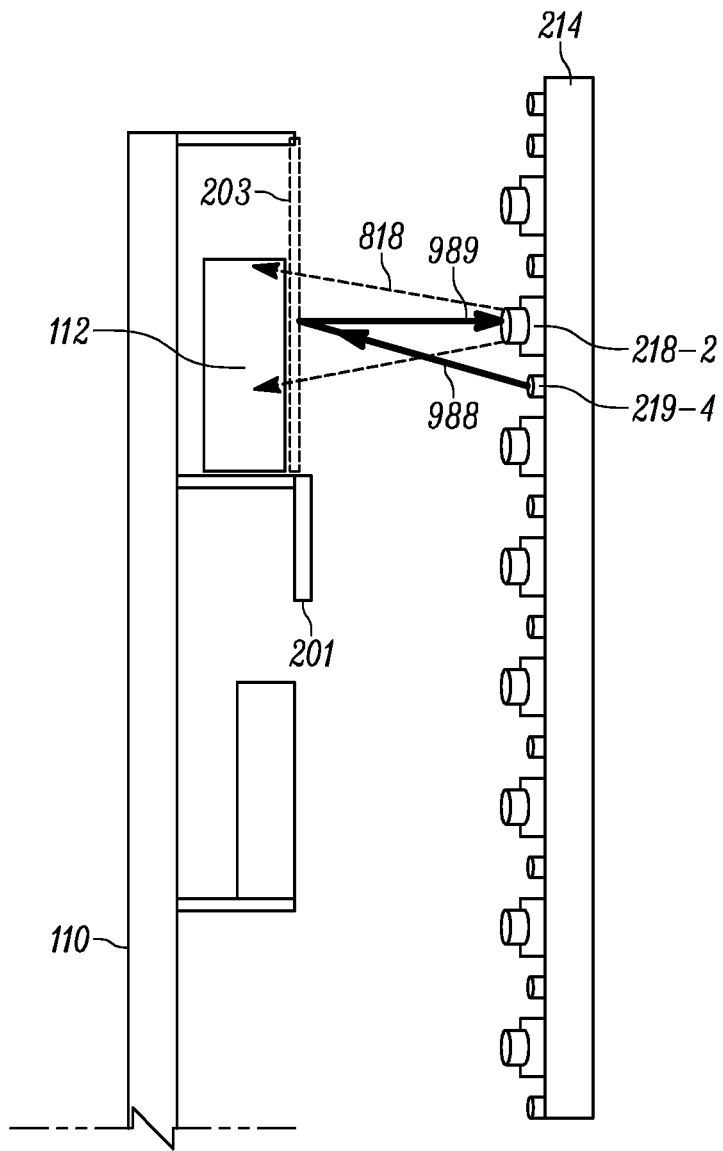
FIG. 9 depicts a light source producing parasitic reflections in a camera of the apparatus of FIG. 2 in accordance with some embodiments.
Figure 10:
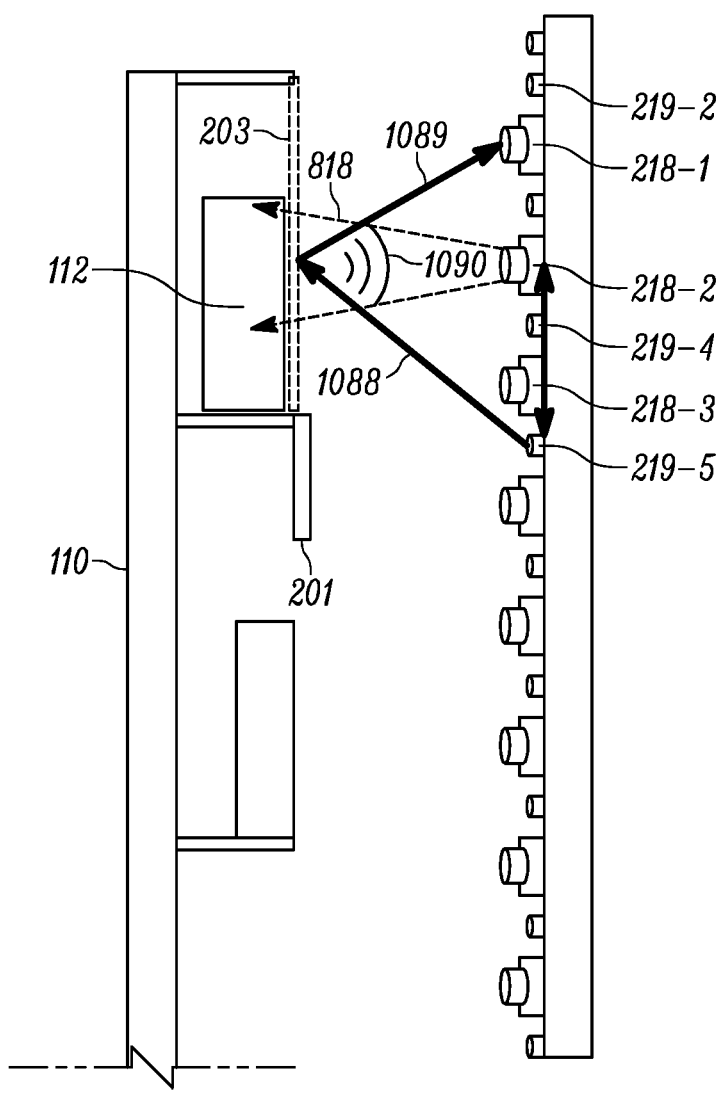
FIG. 10 depicts a light source arranged to provide illumination for a camera of the apparatus of FIG. 2, without parasitic reflections, in accordance with some embodiments.

Hence, attention is next directed to FIG. 8, FIG. 9, and FIG. 10 which depict geometry of the cameras 218 and the light sources 219 relative to each other and a module 110. Indeed, each of FIG. 8, FIG. 9, and FIG. 10 are similar to a portion of FIG. 2, with like elements having like numbers.

In FIG. 8 only one light source 219-1 and one camera 218-1 are indicated for clarity. However, FIG. 8 depicts fields of view 818 of the camera 218, depicted as dashed lines, which at least partially overlap, for example, at least in plane of their respective focal distance and/or in a plane of their respective focal depths, each of which are generally selected to about coincide with the items being imaged, for example the retail products 112 and/or the labels 201. Indeed, while the cameras 218 are generally assumed herein to have similar focal distances and/or similar depths of field, in other embodiments, at least one of the cameras 218 has a different focal distance and/or a different depth of field from the other cameras 218. Furthermore, it is generally assumed that the apparatus 103 is navigated relative to the module 110 such that the items to be imaged are within the respective focal distances and/or in the respective focal depths of the cameras 218. As adjacent fields of view 818 overlap, the entire vertical length of the module 110, at least from the top camera 218 to the bottom camera 218 is imageable.

Attention is next directed to FIG. 9 which depicts a given camera 218-2 being operated to image the product 112 behind the glass door 203, as indicated by its field of view 818. In FIG. 9, an adjacent light source 219-4, is operated to provide illumination light 988 to illuminate the product 112 behind the glass door 203. However, the light source 219-4 is located such that parasitic reflections 989 from the illumination light 988, are reflected into the camera 218-2, for example by the door 203, however such parasitic reflections 989 can also be caused by a surface of the product 112 being shiny, and the like.

Hence, as the light source 219-4 and the camera 218-2 are located relative to each other such that the parasitic reflections 989 from the light source 219-4 enter the camera 218-2, the light source 219-4 is not paired with the camera 218-2. Indeed, the situation depicted in FIG. 9 represents an issue that is at least partially addressed by the method 700.

Attention is next directed to FIG. 10 which depicts the given camera 218-2 being operated to image the product 112 behind the glass door 203, as indicated by its field of view 818. In FIG. 10, the adjacent light source 219-4 is not operated due the parasitic reflections 989 as described with regard to FIG. 9. However, a paired light source 219-5 (e.g. the next light source down from the adjacent light source 219-4) is paired with the camera 218-2, as the paired light source 219-5 is located at a distance 1099 from the paired camera 218-2 that both illuminates an object (e.g. the product 112 behind the glass door 203) imaged by the paired camera 218-2, and where parasitic reflections from the paired light source 219-5 are not reflected into the paired camera 218-2. As is apparent from FIG. 10, at least one camera 218-3 is located between the paired light source 219-5 and the paired camera 2189-2 along the mast 214.

For example, as depicted, the paired light source 219-5 emits illumination light 1088 that illuminates the product 112 behind the door 203, such that light 1090 from the product 112, that at least partially comprises the illumination light 1088 interacting with the product 112 imaged by the paired camera 218-2. However, the light 1090 does not include parasitic reflections. As depicted, however, parasitic reflections 1089 from the paired light source 219-5 are reflected into another camera 218-1, adjacent the paired camera 218-2; as such, the camera 218-1 (and any light sources 219 paired with the camera 218-1) are not operated during operation of the paired light source 219-5 and its paired camera 218-2.

Put another way, the controller 320 (e.g. at the block 701 of the method 700) controls the paired light source 219-5 and its paired camera 218-2 to operate at a different time from other paired light sources 219 and other paired cameras 218 located where the parasitic reflections from the paired light source 219-5 are reflected into the other paired cameras 218.

It is further appreciated that the paired light source 219-5 and its paired camera 218-2 are also operated according to the method 500, as described above.

It is yet further appreciated that other cameras 218 located where parasitic reflections from the paired light source 219-5 are not reflected therein can be operated at the same time as the paired light source 219-5 and its paired camera 218-2, as long as the other light sources 219 do not produce parasitic reflections for any of the cameras 218 being operated.

Put another way, the controller 320 (e.g. at the block 703 of the method 700) controls the paired light source 219-5 and its paired camera 218-2 to operate at a same time as associated paired light sources 219 and associated paired cameras 218, the paired camera 218-2 and the associated paired cameras 218 each located where respective parasitic reflections from the paired light source 219-5 and the associated paired light sources 219 are not reflected into the paired camera 218-2 and the associated paired cameras 218.

Put yet another way, the plurality of cameras 218 are sequenced to operate with their respective paired light sources 219 such that any given camera 218 is not receiving parasitic reflections and to maximize the number of cameras 218 that are simultaneously acquiring images.

Figure 11:
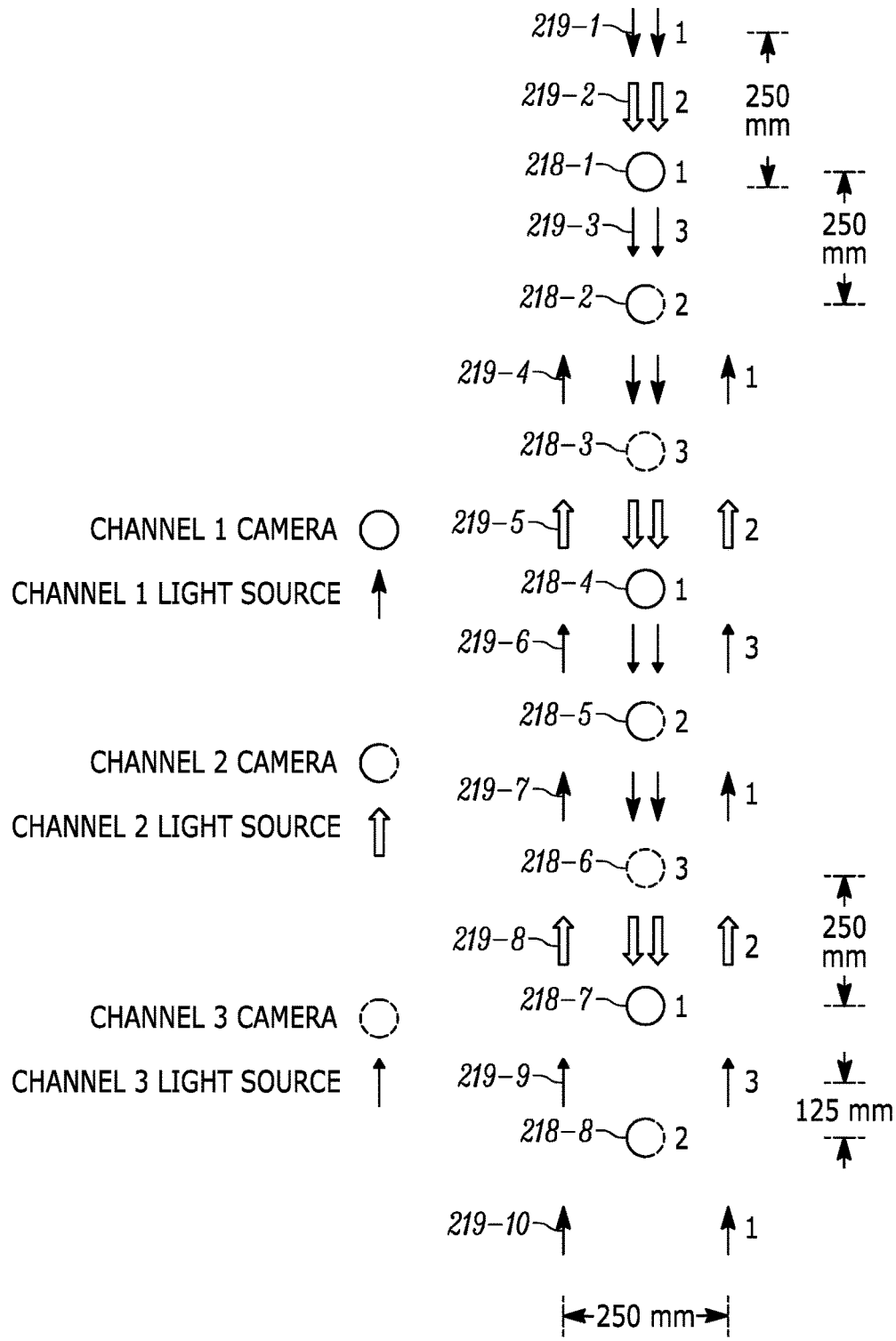
FIG. 11 depicts geometry of the cameras and the light sources of the apparatus of FIG. 2, as well as a channel arrangement, in accordance with some embodiments

Sequencing of the cameras 218 with paired light sources 219 is now described with respect to FIG. 11 which schematically depicts a perspective view of the cameras 218 and their paired light sources 219, as well as associations therebetween. While not depicted, it is assumed that the cameras 218 and the light sources 219 are arranged along the mast 214 of the apparatus 103.

Referring to FIG. 11, it is apparent that each light source 219 is located in rows along the mast 214 and/or support structure, perpendicular to a line between the plurality of cameras 218. For example, as depicted, each light source 219 comprises a plurality of light emitting diodes (and the like), indicated by a respective arrow. Furthermore, a direction of a respective arrow indicates a pitch of a respective LED and/or light source. For example, in some embodiments, LEDs (and the like) indicated by an "up" arrow are pitched upwards at an angle of about 30°, while LEDs (and the like) indicated by a "down" arrow are pitched downwards at an angle of about 30°. However, other angles are within the scope of present embodiments. In particular, a pitch of a light source 219 is selected to provide illumination light for a paired camera 218 and such that parasitic reflections do not occur for the paired camera 218. In other words, in example embodiments, each of the plurality of light sources 219 is pitched, with respect to the mast 214 and/or support structure, in a direction of an associated paired camera 218.

From FIG. 11 it is further apparent that the cameras 218 and the light sources 219 are organized into three channels, each channel operated in sequence, with all cameras 218 and all light sources 219 in a given channel being associated and operated simultaneously, with the cameras 218 and the light sources 219 in the other channels operated at a different time.

Hence, in a given channel, none of the light sources 219 produce parasitic reflections for the cameras 218 in the given channel.

The channel with which each of the cameras 218 and the light sources 219 are associated is indicated both by a number adjacent each of the cameras 218 and the light sources 219 (e.g. "1", "2", or "3", indicating, respectively, association with channel 1, channel 2, or channel 3), as well as graphically, with sets of cameras 218 associated with a respective channel being graphically the same, and set of light sources 219 associated with a respective channel indicated by the same respective arrow type.

Hence, for example, the cameras 218-1, 218-4, 218-7 and the light sources 219-1, 219-4, 219-7, 219-10 are in channel 1, the cameras 218-2, 218-5, 218-8 and the light sources 219-2, 219-5, 219-8 are in channel 2, and the cameras 218-3, 218-6, and the light sources 219-3, 219-6, 219-9 are in channel 3.

Furthermore, a given camera 218 (e.g. in a given channel) is paired with at least a first subset of the plurality of light sources 219 located on one side of the given camera 218, and a second subset of the plurality of light sources 219 located on an opposite side of the given camera 218. For example, camera 218-1, of channel 1, is paired with the LEDs (and the like) of the light source 219-1 of channel 1, and the camera 218-1 is paired with the LEDs (and the like) of the light source 219-4 (also of channel 1) which are pitched towards the camera 218-1 (e.g. indicated by the direction of the arrows).

Furthermore, the camera 218-4 of channel 1 is paired with the LEDs (and the like) of the light source 219-4 (also of channel 1) that are pitched towards the camera 218-4 (e.g. as indicated the direction of the arrows), as well as the LEDs (and the like) of the light source 219-7 (also of channel 1) that are pitched towards the camera 218-4.

Hence, the LEDs (and the like) in each row of a light source 219 are generally operated at a same time, as each of the LEDs in a row of a light source 219 is associated with paired cameras 218 in a given channel. In other words, the geometry of the LEDs in each row is such that for all cameras 218 operated while all the LEDs in a row (as well for other light sources) are operated, parasitic reflections do not occur. Put another way, in depicted embodiments, associated subsets of the plurality of light sources 219 are located in rows along the mast 214, perpendicular to a line between the plurality of cameras 218, and at least some of the rows of the associated subsets of the plurality of light sources 219 are operated at a same time to provide illumination light for at least two of the plurality of cameras 218. Some rows, however, provide illumination light for only one of the plurality of cameras 218.

In any event, from FIG. 11 it is hence apparent that for any light source 219, some of the LEDs (and the like) can be paired with one camera 218 in a channel, while other LEDs (and the like) can be paired another camera 218 in the same channel. However, as long as the various LEDs, and the like, are in the same channel, they are operated simultaneously.

From FIG. 11, some of the light sources 219 include four LEDs (and the like) and others include two LEDs (and the like). For the light sources 219 which include four LEDs (and the like), two of the LEDs are pitched in one direction (e.g. the two outer LEDs), while the two other LEDs are pitched in an opposite direction (e.g. the two inner LEDs). However, the arrangement and pitch of the LEDs, and the like, for each light source 219 is generally determined heuristically, given a particular geometry of the mast 214 and/or support structure onto which the cameras 218 and light sources 219 are being provisioned.

Indeed, as depicted, the outer LEDs are 250 mm apart (center-to-center), the cameras 218 are 250 mm apart (center-to-center), and a camera 218 to an adjacent light source row is 125 mm (center-to-center). Furthermore, the two top light sources 219-1, 219-2 include only two LEDs (and the like) each, and are paired, respectively, with camera 218-1 and camera 218-2.

Indeed, in some embodiments, at least a portion of the cameras 218 are paired with light sources 219 located on either side.

Operation of the channels is described with reference to FIG. 12 which depicts a timing diagram 1200 that depicts a portion of three pairs of pulse trains, one for each of channel 1, channel 2 and channel 3, showing exposure times and pulse for each camera 218 and light source 219 in each of the channels. Each of the pairs of the pulse trains are the same as the pulse trains 618, 619 of FIG. 6, but offset from one another such that during any given exposure time for a set of cameras 218 of a given pulse train, the light sources 219 of the other channels are off. Each pair of pulse trains otherwise operate according to the method 500. In other words, for clarity only a portion of each of the pair of pulse trains are depicted showing only a single camera exposure event for each channel.

Figure 12:
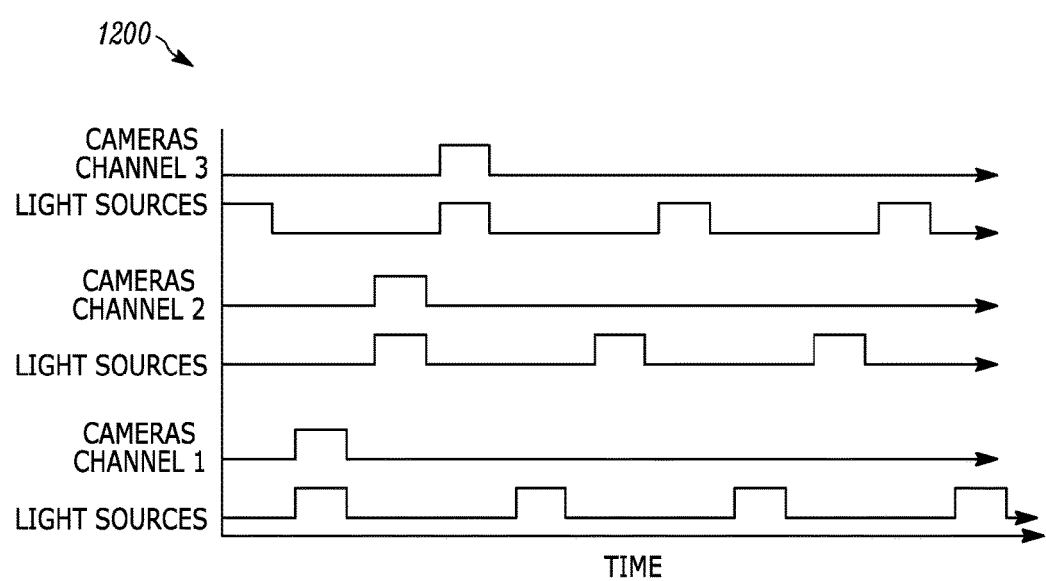
FIG. 12 is a timing diagram for implementing the method of FIG. 7 in accordance with some embodiments.

Hence, from FIG. 12, it is apparent that, for each channel, paired light sources and paired cameras are operated at a different time (e.g. at the block 701 of the method 700) from other paired light sources and other paired cameras (e.g. at the other channels); it is further apparent that, for each channel, paired light sources and paired cameras are operated at a same time (e.g. at the block 703 of the method 700) as associated paired light sources and associated paired cameras (e.g. of the same channel).

Indeed, the plurality of cameras 218 are operated in a sequence with associated paired light sources 219, for example, using a channel-based architecture. Indeed, once the geometry of the cameras 218 and the light sources 219 are provisioned, and the cameras 218 and the light sources 219 are grouped into channels, according to the geometry of the parasitic reflections produced by the light sources 219, the cameras 218 and the light sources 219 are operated according to a timing scheme, for example as represented by FIG. 12.

While not depicted, once the images from the cameras 218 are acquired, the images are transmitted to the server 101 for processing.

While the cameras and light sources have been described herein as being located along a common housing and/or support structure, in other embodiments the cameras and light sources described herein are located in respective housings and/or respective support structures and positioned relative to one another using any suitable components.

In any event, provided herein is a device, and in particular a mobile automation apparatus, that includes cameras and light sources configured to acquire clear images while moving, including, but not limited to decodable images of barcodes using, for example, a short exposure time on the cameras. During this short exposure time, a large amount of illumination is generally used to ensure that details of the images are decodable, for example on the order of 500 W.

However, the high brightness of the light sources causes potential issues with glare off of products, label covers, and glass doors (freezer section of grocery dept.). Hence, the cameras and the light sources are physically separated such that the chances of parasitic reflection from the light sources to the camera (e.g. glare) is reduced. However, as a plurality of cameras are used, light sources adjacent to a given camera that are used to provide illumination for a camera that is further away, can cause glare on the adjacent camera. Hence, the cameras and light sources are operated in a sequence such that no camera is acquiring images while an adjacent and/or glare producing light source is on. Furthermore, the frequency and pulse duration of the light sources is controlled to reduce the impact on a battery as well as to eliminate potential for discomfort to an observer.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover, in this document, language of "at least one of X, Y, and Z" and "one or more of X, Y and Z" can be construed as X only, Y only, Z only, or any combination of two or more items X, Y, and Z (e.g., XYZ, XY, YZ, XZ, and the like). Similar logic can be applied for two or more items in any occurrence of "at least one . . . " and "one or more . . . " language.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

We claim:

1. A device comprising:
a support structure;
a plurality of cameras spaced along the support structure, wherein adjacent cameras have partially overlapping fields of view directed away from the support structure; and,
a plurality of light sources comprising at least one light source paired with each of the plurality of cameras,
wherein a paired light source is located at a distance from a paired camera that illuminates an object imaged by the paired camera, and where parasitic reflections from the paired light source are not reflected into the paired camera, and
wherein the paired light source and the paired camera are operated at a different time from other paired light sources and other paired cameras located where the parasitic reflections from the paired light source are reflected into the other paired cameras.

2. The device of claim 1, wherein the paired light source and the paired camera are operated at a same time as associated paired light sources and associated paired cameras, the paired camera and the associated paired cameras each located where respective parasitic reflections from the paired light source and the associated paired light sources are not reflected into the paired camera and the associated paired cameras.

3. The device of claim 1, wherein the plurality of cameras is operated in a sequence with associated paired light sources.

4. The device of claim 1, further comprising a mobile automation apparatus, the support structure disposed on the mobile automation apparatus, the plurality of cameras and the plurality of light sources spaced along the support structure.

5. The device of claim 1, further comprising a mobile automation apparatus, the support structure comprising a mast disposed on the mobile automation apparatus, the plurality of cameras and the plurality of light sources vertically spaced along the mast.

6. The device of claim 1, wherein at least one camera is located between the paired light source and the paired camera along the support structure.

7. The device of claim 1, wherein each of the plurality of light sources is pitched, with respect to the support structure, in a direction of an associated paired camera.

8. The device of claim 1, wherein a given camera, of the plurality of cameras is paired with at least a first subset of the plurality of light sources located on one side of the given camera, and a second subset of the plurality of light sources located on an opposite side of the given camera.

9. The device of claim 1, wherein associated subsets of the plurality of light sources are located in rows along the support structure, perpendicular to a line between the plurality of cameras, and wherein at least some of the rows are operated at a same time to provide illumination light for at least two of the plurality of cameras.

10. A method comprising:
at device comprising: a controller; a support structure; a plurality of cameras spaced along the support structure, wherein adjacent cameras have partially overlapping fields of view directed away from the support structure; and, a plurality of light sources comprising at least one light source paired with each of the plurality of cameras, wherein a paired light source is located at a distance from a paired camera that illuminates an object imaged by the paired camera, and where parasitic reflections from the paired light source are not reflected into the paired camera,
controlling, using the controller, the paired light source and the paired camera to operate at a different time from other paired light sources and other paired cameras located where the parasitic reflections from the paired light source are reflected into the other paired cameras; and
controlling, using the controller, the paired light source and the paired camera to operate at a same time as associated paired light sources and associated paired cameras, the paired camera and the associated paired cameras each located where respective parasitic reflections from the paired light source and the associated paired light sources are not reflected into the paired camera and the associated paired cameras.

* * * * *